United States Patent [19]
Chao et al.

[11] Patent Number: 5,847,529
[45] Date of Patent: Dec. 8, 1998

[54] ROBOT PROTECTION SYSTEM

[75] Inventors: C.H. Chao, Hsin-Tan; C.H. Hsu, Chung Ho; C.R. Hsieh, Miou Lin, all of Taiwan

[73] Assignee: Taiwan Semiconductor Manufacturing Co. Ltd., Hsin-Chu, Taiwan

[21] Appl. No.: 844,381

[22] Filed: Apr. 18, 1997

[51] Int. Cl.$^6$ .............................. B65G 25/00; B25J 15/02
[52] U.S. Cl. .................... 318/568.21; 318/563; 318/565; 414/217
[58] Field of Search ................... 318/560–579; 414/217–226, 935–941

[56] References Cited

U.S. PATENT DOCUMENTS

| | | | |
|---|---|---|---|
| 4,616,683 | 10/1986 | Tullis et al. | 141/98 |
| 4,705,444 | 11/1987 | Tullis et al. | 414/226 |
| 4,923,353 | 5/1990 | Tullis et al. | 414/226 |
| 5,588,789 | 12/1996 | Muka et al. | 414/217 |
| 5,601,484 | 2/1997 | Adler et al. | 454/187 |
| 5,642,978 | 7/1997 | Lahne et al. | 414/331 |
| 5,664,925 | 9/1997 | Muka et al. | 414/217 |

Primary Examiner—Brian Sircus
Attorney, Agent, or Firm—Tung & Associates

[57] ABSTRACT

The present invention embodies a safety interlock system and method for automatically disabling operation of a robot or other machine with standard mechanical interfaces (SMIF) apparatus if the components are not in proper operating positions when the machine is started. In a preferred embodiment the safety interlock is incorporated in a robotic machine for processing semiconductor wafers and the system uses three conventional sensors for detecting whether the transfer robot is in the out position or not, whether the cassette elevator is "home" or not, and whether the cassette gripper on the transfer robot is open or closed. A logic circuit has the outputs of the robot "out" sensor and the cassette elevator "home" sensor input to a NAND gate, the output of which is input to an OR gate along with the output of the "open" sensor of the SMIF robot arm gripper. An appropriate output from the OR gate lights an LED setting off an audible alarm and opening a breaker that automatically disables the SMIF robot motor. Thus, when the machine is started, the system checks the outputs of the three sensors and if no output results from the OR gate the SMIF apparatus goes to work. If an output from the OR gate does result, the alarm is set off, the breaker is opened disabling the SMIF apparatus and preventing further machine operation.

10 Claims, 2 Drawing Sheets

ROBOT PROTECTION SYSTEM

FIELD OF THE INVENTION

The present invention generally relates to robotic and other machines with standard mechanical interfaces (SMIF) apparatus and, more particularly, to a safety interlock system which is activated automatically to stop movement of the SMIF apparatus if its components are not in their proper operating positions when the machine is started.

BACKGROUND OF THE INVENTION

Presently, robotic and other machines having a SMIF apparatus for remotely handling workpieces, e.g., semiconductor-wafer-handling devices having a SMIF apparatus with grippers that open and close in loading and unloading wafer-carrying cassettes in a processing tool, use safety sensors for detecting whether the robot transfer mechanism is out or not, whether the workpiece or cassette elevator is "home" or not, and whether the workpiece or cassette gripper is open or closed. If one of the sensors detects that the transfer mechanism is at the out position, the cassette elevator is home, or the cassette gripper is open, an alarm sounds to indicate to a machine operator that the machine must be stopped to avoid damage. For example, if the robot transfer mechanism is still in the cassette, and the operator starts the unload operation, the wafers may be dropped and the machine can be damaged.

While these alarms have been generally useful, the use of the alarm alone relies on the machine operator to react quickly enough to prevent serious damage to the machine. This places a burden on the operator and fails to definitely avoid such damage.

It is therefore an object of the present invention to provide an additional feature in robotic machines with SMIF apparatus in the form of a safety interlock system that automatically disables operation of the SMIF apparatus when the components are not in selected positions when the machine is started.

It is a further object of the invention to provide a safety interlock system in robotic machines with SMIF apparatus that utilizes existing sensors to activate the safety interlock.

SUMMARY OF THE INVENTION

In accordance with the present invention, a safety interlock system and method are provided for automatically disabling operation of a robot or other machine with standard mechanical interfaces (SMIF) apparatus if the components are not in proper operating positions when the machine is started. In a preferred embodiment wherein the invention is in the form of a safety interlock incorporated in a robotic machine for processing semiconductor wafers, the system uses three conventional sensors for detecting whether the robot transfer mechanism is in the out position or not, whether the cassette elevator is in the "home" position or not, and whether the gripper on the transfer apparatus is open or closed. A logic circuit is provided that has a NAND gate into which the outputs of the robot "out" sensor and the cassette elevator "home" sensor are input and the output of which is input to an OR gate along with the output of the "open" sensor of the transfer gripper. An appropriate output from the OR gate, indicating that at least one of the sensors detects a component in an unselected position or condition, lights an LED setting off an audible alarm and opening a breaker that disables a SMIF apparatus motor. Accordingly, when the machine is started, the system checks the outputs of the three sensors and if no output results from the OR gate the SMIF apparatus goes to work. If an output from the OR gate does result, the alarm is set off, and the breaker is opened to disable the SMIF apparatus and prevent further machine operation.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention relates to robots or other machines with standard mechanical interfaces (SMIF) apparatus and provides a system and method for automatically disabling the operation of such a robot or other machine if the SMIF components are not in proper selected operating positions when the machine is started.

Figure 1:
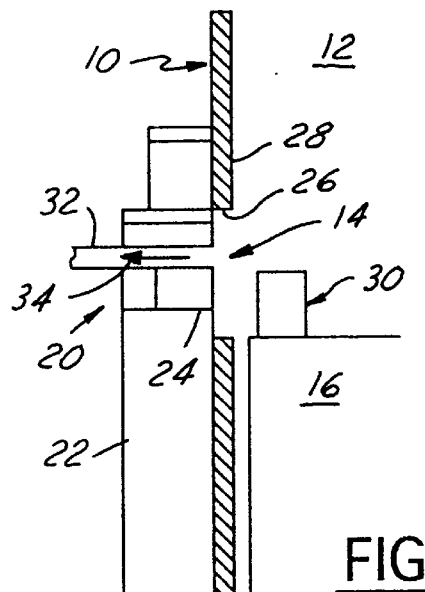
FIG. 1 is a diagrammatic view of a portion of a robotic machine system including a clean room process tool with a cooperating SMIF apparatus for inserting wafer-filled cassettes therein in accordance with the prior art.

Referring initially to FIG. 1, a portion of a prior art robotic machine system, of a type suitable for incorporation of the present invention, is shown including a SMIF apparatus 20 for inserting a workpiece holder, such as a cassette 30 containing semiconductor wafers or other substrates, into a chamber 12 of a clean room process tool 10. As shown in the Figure, a conventional SMIF apparatus 20 consists of a robotic transfer system composed of a transfer arm or other mechanism 32, which is normally configured with a device for gripping the top of a cassette 30 disposed inside a pod 18 on a platform/elevator 22. The pod 18 is a sealed container, with an opening at the bottom, to prevent contamination of the cassette 30 held therein. The apparatus 20 has a port or opening 24 that is intimately mated with an opening 26 in the sidewall 28 of the process tool 10 forming a loading and unloading section 14 of the tool. A cassette 30 of wafers can be transported into the process tool 10 in a SMIF pod 18 through the mating openings by means of the robotic transfer mechanism 32 with gripper assembly 34 which is capable of transporting a gripped cassette 30, containing wafers to be processed, into the chamber 12 in the process tool 10 and of then placing the cassette 30 vertically onto a platform 16 in the chamber 12 so that the cassette 30 is oriented horizontally for processing.

At the beginning of the transfer process, an operator positions a SMIF pod 18 on top of the platform/elevator 22 with the pod containing a cassette 30 holding a number of wafers in an upright position. The elevator 22 then descends into the SMIF apparatus 20 to orient the cassette 30 at the loading and unloading section 14 so that the robotic transfer mechanism 32 can transport the pod 18 and cassette 30 into the process tool 10. The pod 18 may be equipped with a tagging system for the automated identification and recognition of the parts contained in the pod 18 to prevent mis-processing of the wafers and to track product-lot serial numbers through a control computer. The tagging system may be mounted on the pod 18 with a probe assembly mounted at the port 24 of the SMIF apparatus 20. The SMIF apparatus 20 is therefore an effective interface between an operator and the process tool 10 in that the transporting of a cassette 30 can be conducted in a completely automated fashion to avoid human contact by the operator and thus insure that the cassettes are transported through a highly clean environment into the process tool 10.

In addition to a tagging system, the conventional SMIF apparatus has three safety sensors for sensing three selected conditions or positions of components of the SMIF apparatus. As seen generally in FIG. 2, one sensor 40 detects whether the SMIF or robot transfer mechanism 32 is in the out position or not, a second sensor 42 detects whether the cassette elevator 22 is in its "home" position or not, and the third sensor 44 detects whether the gripper 34, of the SMIF transfer mechanism 32, is opened or closed. The outputs of the three sensors are input to a logic block 46. If any one of the sensors detects, upon starting the machine, that either the robot transfer mechanism 32 is at the out position, the cassette elevator 22 is at home, or the SMIF gripper 34 is open, the logic block 46 outputs an alarm signal. Currently, the alarm signal causes an alarm to sound indicating to a machine operator that the machine must be stopped to avoid damage. If the operator does not respond quickly enough the machine and/or the wafers may be damaged. However, with the present invention, an automatic safety interlock is provided to immediately disable the SMIF apparatus 20. Accordingly, the invention provides an alarm and breaker block 48 which is disposed to receive the alarm signal from the logic block 46 and to cause the alarm to sound, in this case for notifying the machine operator that the machine is being stopped, and additionally a disable signal is input to the SMIF apparatus 20 to cease its operation.

Figure 2:
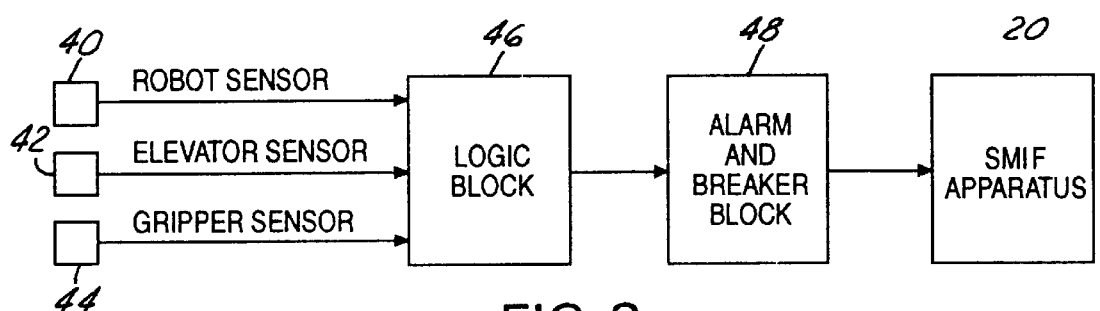
FIG. 2 is a block diagram of a robotic machine system including a safety interlock system in accordance with the present invention.
Figure 3:
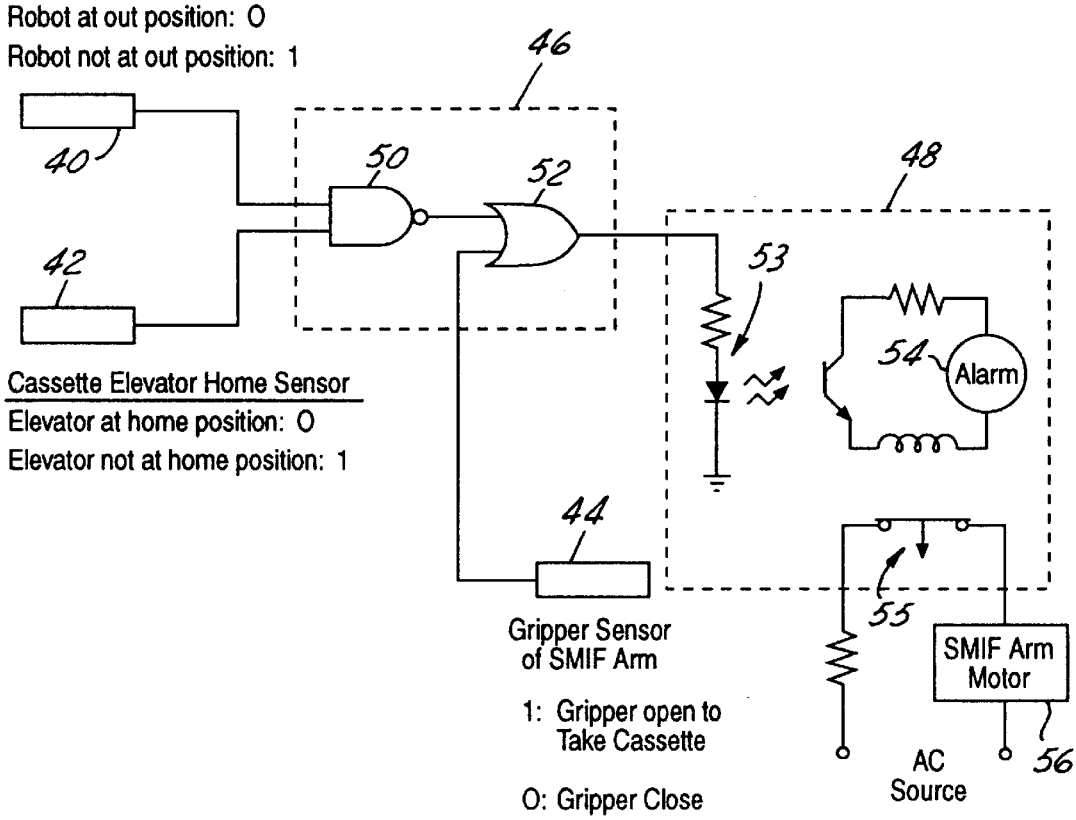
FIG. 3 is a schematic diagram of the circuitry for operating the safety interlock in the machine of FIG. 2 along with the logic tables for the NAND and OR gates therein.

FIG. 3 is a schematic diagram of a preferred embodiment of the circuitry for operating the safety interlock system in the machine of FIG. 2 along with the respective logic Tables 1 and 2 for a NAND gate 50 and OR gate 52 in the logic block 46. As seen in FIG. 3, the robot "out" sensor 40 and the cassette elevator sensor 42 produce binary outputs, the values of which depend on whether the robot is at the out position (e.g., 0) or not at the out position (1), and whether the cassette elevator is at the home position (0) or not at the home position (1). These binary outputs are input to the NAND gate 50 which produces a binary output signal according to the logic Table 1. The output signal from the NAND gate 50 is input along with a binary output from the SMIF transfer mechanism gripper sensor 44 to the OR gate 52. When the gripper 34 is open to take a cassette 30, the gripper sensor 44 outputs a "1" and when the gripper is closed a "0" is output. These binary outputs when input to the OR gate 52 produce an output according to the logic Table 2. It will be seen that three of the four logic combinations, corresponding to improper positions or conditions being sensed by at least one of the sensors, will produce an alarm signal (1) from the OR gate 52. The alarm signal from OR gate 52 may be used to light an LED 53 to provide a visual warning. The light from the LED 53 can produce a signal which activates an audible alarm 54 and opens a circuit breaker 55 that cuts off power to and disables the SMIF transfer mechanism motor 56. Thus, if the machine is to be started when any one of the three components monitored by the sensors 42, 44, and 46, is not in a selected position or condition, i.e., in an undesirable condition that might cause damage to the machine, the transfer mechanism 32 will be automatically disabled by an output from the OR gate 52.

Figure 4:
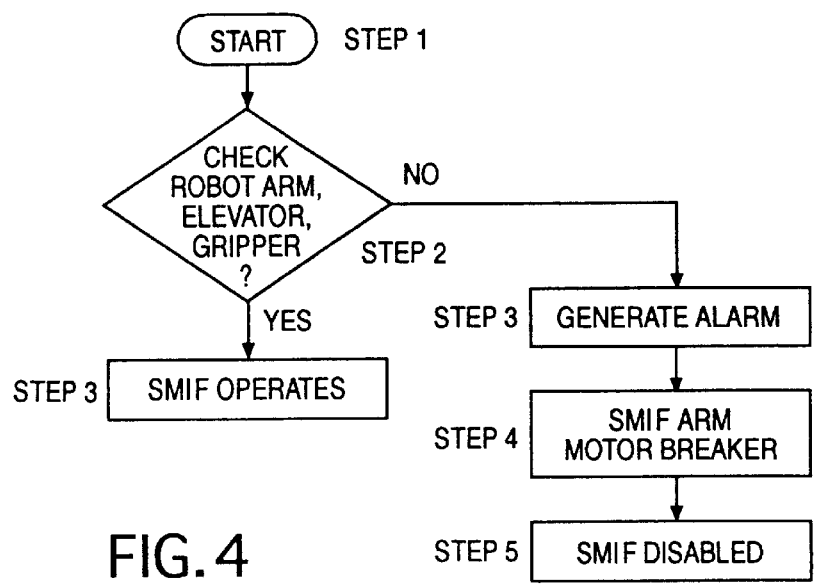
FIG. 4 is a flowchart illustrating the operating steps executed by the system of the present invention.

The method of operation of the safety interlock system is illustrated in the flowchart of FIG. 4. To begin with, in step 1 the machine is started. When the machine is started, the three sensors are energized and their outputs checked in step 2 to determine if the components are properly positioned. If they are in their selected positions or conditions, a YES indication results and no output is produced from the OR gate 52 so that the SMIF apparatus goes to work in step 3. If the components are not in the proper condition, a NO indication results and an output from the OR gate 52 is produced, setting off the alarm in step 3, and the breaker is opened in step 4, disabling the SMIF apparatus in step 5 and preventing further machine operation.

While the present invention has been described in an illustrative manner, it should be understood that the terminology used is intended to be in the nature of words of description rather than of limitation. For example, the binary values indicated in the operation of the logic block elements may be altered or inverted appropriately as well as the elements themselves.

Furthermore, while the present invention has been described in terms of a preferred embodiment, it is to be appreciated that those skilled in the art will readily apply these teachings to other possible variations of the invention. For example, applications may be found in microscopes, such as SEMs and surface scanners, and other machines wherein a cooperating SMIF apparatus is readily incorporated.

The embodiment of the invention in which an exclusive property or privilege is claimed are defined in the following claims:

We claim:

1. A system for avoiding damage, due to improper operation, to a machine for moving workpieces using a SMIF apparatus, having a workpiece elevator and a robot transfer mechanism with a workpiece gripper, and comprising:

a first sensor means for detecting whether the robot transfer mechanism is in a selected condition, and producing a first indicative output;

a second sensor means for detecting whether the workpiece elevator is in a selected condition, and producing a second indicative output;

a third sensor means for detecting whether the workpiece gripper is in a selected condition and producing a third indicative output;

wherein the improvement comprises, a logic circuit comprising:

means, responsive to said first, second, and third indicative outputs, for determining whether said robot transfer mechanism, said workpiece elevator, and said workpiece gripper are all in said selected conditions; and means for outputting a disabling signal when at least one of said transfer mechanism, elevator, and gripper is not in its selected condition; and means, responsive to said disabling signal, for disabling said SMIF apparatus.

2. A system according to claim 1, wherein said logic circuit comprises a NAND gate and an OR gate, and said determining means comprises:

means for inputting said first and second indicative outputs from said transfer mechanism and said workpiece elevator sensors to said NAND gate; and means for inputting said third indicative output from said workpiece gripper sensor to said OR gate along with the output of said NAND gate.

3. A system according to claim 2, wherein said disabling signal outputting means comprises means for inputting the output of said OR gate to said disabling means.

4. A system according to claim 1, wherein said robot transfer mechanism comprises an operating arm powered by a motor, and said disabling means comprises a circuit breaker for cutting off power to said motor.

5. A system according to claim 1, wherein said workpieces comprise semiconductor-wafer-carrying cassettes and said robot transfer mechanism comprises means for moving said cassettes into a clean room environment.

6. A method for automatically preventing damage, due to improper operation, to a machine for moving workpieces with a SMIF apparatus having a robot transfer mechanism with a workpiece gripper, and a workpiece elevator, comprising the steps of:

provicing a first sensor for detecting whether the robot transfer mechanism is in a first selected condition or not, and producing a first indicative output, providing a second sensor for detecting whether the workpiece gripper is in a second selected condition or not and producing a second indicative output;

providing a third sensor for detecting whether the workpiece elevator is in a third selected condition or not, and producing a third indicative output;

inputting said first, second, and third indicative outputs to a logic circuit to determine whether said transfer mechanism, said workpiece gripper, and said workpiece elevator, are all in said selected conditions; and outputting a signal disabling said SMIF apparatus when at least one of said transfer mechanism, workpiece gripper, and workpiece elevator is not in its selected position.

7. A method according to claim 6, wherein said inputting step comprises:

inputting said first and second indicative outputs from said transfer mechanism and said workpiece elevator sensors to a NAND gate in said logic circuit; and inputting said third indicative output from said workpiece gripper sensor to an OR gate in said logic circuit along with the output of said NAND gate.

8. A method according to claim 7, wherein said outputting step comprises inputting the output of said OR gate to a transfer robot disabling device.

9. A method according to claim 6, wherein said workpieces comprise semiconductor-wafer-carrying cassettes and said robot transfer mechanism moves said cassettes into a clean room environment.

10. Apparatus for avoiding damage, due to improper operation, to a machine for moving semiconductor-wafer-carrying cassettes into a clean room environment with a SMIF apparatus, having a cassette elevator and a robot transfer arm with a cassette gripper, and comprising:

a first sensor for detecting whether the robot transfer arm is in the out position or not, and producing an indicative output signal;

a second sensor for detecting whether the cassette gripper on the transfer arm is open or closed and producing an indicative output signal;

a third sensor for detecting whether the cassette elevator is "home" or not, and producing an indicative output signal;

wherein the improvement comprises:

a logic circuit comprising a NAND gate and an OR gate;

means for inputting said three indicative output signals to said logic circuit to determine whether said robot transfer arm, said cassette elevator, and said cassette gripper are all in selected conditions, said inputting means comprising:

means for inputting said first and second indicative outputs from said transfer arm and said cassette elevator sensors to said NAND gate; and means for inputting said third indicative output from said cassette gripper sensor to said OR gate along with the output of said NAND gate;

means for disabling said robot transfer arm; and means for outputting a signal disabling said robot arm when at least one of said robot arm, cassette elevator, and cassette gripper is not in its selected position, said disabling signal outputting means comprising means for inputting the output of said OR gate to said disabling means.

* * * * *